Oct. 11, 1966

HUNG CHANG LIN 3,278,853

INTEGRATED CIRCUITS WITH FIELD EFFECT TRANSISTORS AND DIODE BIAS MEANS

Filed Nov. 21, 1963

WITNESSES:

Bernard R. Gieguez

James T. Young

INVENTOR

Hung Chang Lin

BY Gordon H. Telfer

ATTORNEY

United States Patent Office 3,278,853
Patented Oct. 11, 1966

3,278,853

INTEGRATED CIRCUITS WITH FIELD EFFECT TRANSISTORS AND DIODE BIAS MEANS

Hung Chang Lin, Silver Spring, Md., assignor to Westinghouse Electric Corporation, Pittsburgh, Pa., a corporation of Pennsylvania Filed Nov. 21, 1963, Ser. No. 325,373
6 Claims. (Cl. 330—24)

This invention relates to electronic apparatus employing field effect transistors and, more particularly, to bias means for field effect transistors in semiconductor integrated circuits.

A field effect transistor, also called a unipolar transistor, is a known type of active device which has been incorporated in semiconductor integrated circuitry. The device is characterized by having a high input impedance and low noise which makes it suitable for use as an input stage from transducers that develop a high voltage and low current such as phonograph pickups, infrared detectors and the like. Reference should be made to copending application Serial No. 197,975, filed May 28, 1962, by H. C. Lin and K. K. Yu, now Patent 3,210,677, issued October 5, 1965, and assigned to the assignee of the present invention, for a description of the utilization of field effect transistors as an input stage in integrated circuitry.

For satisfactory operation, the gate of a field effect transistor should be biased through a high resistance, generally of the order of megohms, to prevent the high input impedance of the field effect transistor from being shunted to a low value. Unfortunately, the provision of a resistance of the order of megohms in a semiconductor integrated circuit is impractical because of the very large amount of surface area required. This results from the fact that ordinary procedures for producing resistances yield, typically, resistance magnitudes of about 200 ohms per square. Consequently, in most prior instances where field effect transistors have been included in integrated circuitry, a large external resistance has been required to achieve the proper biasing of the field effect transistor.

Therefore, it is an object of the present invention to provide improved semiconductor integrated circuits utilizing field effect transistors.

Another object is to provide a bias resistance for field effect transistors that may be readily included in a small portion of a semiconductor integrated circuit.

Another object is to provide a bias resistance for field effect transistors that may be bypassed or coupled by relatively small capacitance, which capacitance can be readily included in a small portion of a semiconductor integrated circuit.

The invention, in brief, achieves the above-mentioned and additional objects and advantages by electrically connecting a p-n junction diode to the gate contact of a field effect transistor. The diode is arranged so that upon the application of the bias potential to the diode, the diode is in a forward bias. Since the field effect transistor has a very low gate current, for example of the order of $10^{-9}$ amperes, and the bias potential source supplies negligible current, the diode conducts little current and is placed at an operating point of very high incremental resistance. By the incremental resistance is meant the quantity $kT/qI$ where $k$ is Boltzman's constant, T is the temperature in °K., $q$ is the magnitude of the electron charge and I is the current through the diode. Thus, maintenance of the current at a low level ensures that the diode will provide a resistance of megohms suitable to prevent shunting the high impedance of the field effect transistor.

The diode can be readily incorporated in a semiconductor integrated circuit with the field effect transistor and other elements by known techniques. Utilization of the resistance of a diffused semiconductive region, typically about 200 ohms per square, would require a total area of 5,000 squares or a 1 mil wide strip 5 inches long to provide a resistance of the required magnitude. By the practice of the present invention, a resistance of the required magnitude is provided in a total surface area of no more than about 100 square mils. It is also advantageous that a bypass capacitor can be readily provided even for low frequencies. The required capacitance for bypassing a 25 megohm resistance even at low audio frequencies is in the range of from 100 to 1000 picofarads.

Two or more diodes can be used to advantage in the bias circuit to increase the dynamic range of the signal voltage. It will be noted from the above typical figures that the provision of several diodes will still require less area than a bulk resistance in an integrated circuit.

The present invention, together with the above-mentioned and other objects and advantages thereof, will be best understood by reference to the following description, taken in connection with the accompanying drawing, wherein.

Figure 1:
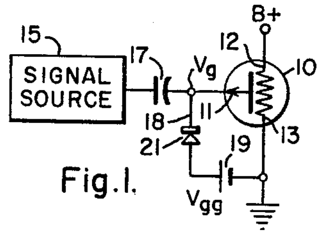
FIGURE 1 is a circuit schematic of an embodiment of the present invention.

Referring to FIG. 1, a common drain circuit combination is shown including a field effect transistor 10 having a gate 11, a source 12 and a drain 13. The current between the source 12 and the drain 13 is modulated by signals applied to the gate 11 by a signal source 15 through a blocking capacitor 17. The signal source 15 is one, such as a phonograph pickup, which provides a voltage signal with negligible current. A bias circuit branch 18, coupled between the drain 13 and the gate 11 includes a bias potential source 19 and a diode 21. The bias potential source supplies a voltage $V_{gg}$ of a polarity suitable to produce a depletion layer in the channel region of the field effect transistor 10 between the source 12 and drain 13. In the example illustrated, where the gate 11 is of n-type semiconductivity and the channel region is of p-type semiconductivity, the bias potential source supplies a positive voltage $V_g$ to the gate which approaches the voltage of the source $V_{gg}$. The diode 21 provides a high resistance in the circuit branch 18 so that the bias circuit branch 18 does not constitute a low impedance shunt across the field effect transistor 10. The blocking capacitor 17 isolates the signal source 15 from the D.C. potential of the bias circuit branch 18.

Figure 2:
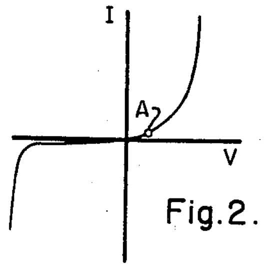
FIG. 2 is a p-n junction diode current-voltage characteristic curve shown to aid in the explanation of the present invention.

The manner in which the diode 21 provides the desired high resistance which is of at least the order of a megohm, may be better understood with reference to FIG. 2. In FIG. 2 is shown the current-voltage characteristic curve of a p-n junction diode. As is well known, in the forward quadrant, the current increases exponentially with increasing voltage. In the reverse direction the current increases very little until a voltage is reached at which breakdown occurs. The high resistance region in the reverse direction of the diode would not be suitable to supply the desired bias resistance because even slight changes in the gate current would cause substantial changes in the voltage drop across the diode. However, in the forward direction near the origin, such as at point A, both current and voltage are very low valued and a stable incremental resistance is provided of a magnitude equal to $kT/ql$ as discussed in the introduction. The diode 21 is biased by the bias potential source 19 in the forward direction to utilize the high incremental resistance of the diode.

It is to be understood that the present invention may be practiced with any active device having a high input impedance at its signal input and which requires a bias resistance of at least the order of the megohm. By the term active device is meant a device providing gain or control of an electrical signal. While in the present discussion particular reference will be made to field effect transistors having a semiconductive channel region and a semiconductive gate region of opposite semiconductivity type, field effect devices wherein the signal input contact or gate is an electrode disposed over a dielectric such as $SiO_2$ are also suitable. The latter devices are often referred to as surface controlled field effect transistors. The present invention does not require any unusual characteristics in the field effect transistor nor of the bias diode since practical devices of the field effect type draw a current of no more than the order of $10^{-8}$ amperes which is suitably low to place the diode at a point of high resistance in the forward quadrant of its characteristic curve.

Figure 3:
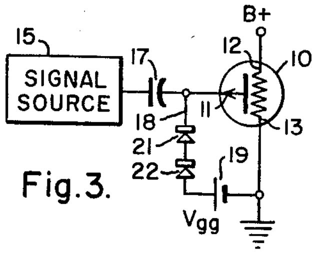
FIGS. 3 and 4 are circuit schematics of alternative embodiments of the present invention.

In FIG. 3, the circuit configuration shown in FIG. 1 has in addition a second diode 22 in the bias circuit branch 18. The purpose of the second diode 22 is to permit greater dynamic range of the signal voltage. That is, the two diodes 21 and 22 permit the input signal to have a greater peak-to-peak voltage range without causing the field effect transistor junction to become forward biased during peak excursion. It is to be understood that in the practice of this invention any number of forward biased diodes may be provided in the bias circuit branch 18 to achieve the desired bias resistance. It will be apparent that in the integration of circuits in accordance with this invention within unitary bodies of semiconductive material several junction diodes may be provided readily without requiring a large amount of surface area.

Figure 4:
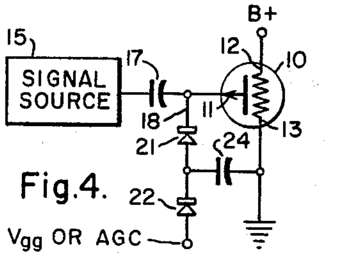

FIG. 4 further illustrates the present invention in a circuit like that of FIG. 3 with the addition of a bypass capacitor 24 between the diodes 21 and 22 and the grounded drain contact.

The bypass capacitor 24 serves to decouple the bias source, $V_{gg}$ or AGC, so that any noise, ripples or signals supplied by the bias source are passed to ground and do not appear at the gate contact.

In the practice of the present invention, the bias applied need not be a fixed one supplying a constant voltage $V_{gg}$. For example, the bias voltage may be derived from an automatic gain control (AGC) voltage circuit.

It should also be noted that in the practice of this invention, the polarity of the supply voltage is not critical. As shown, a B+ supply is used to provide the working current for the field effect transistor. However, a B− is also suitable using the same bias circuit configuration. Where a B− supply is used the direction of the working current is reversed and, hence, the lower grounded contact 13 would serve as the source and the upper contact 12 as the drain of the field effect transistor. The latter circuit configuration is referred to as a common source connection.

Figure 5:
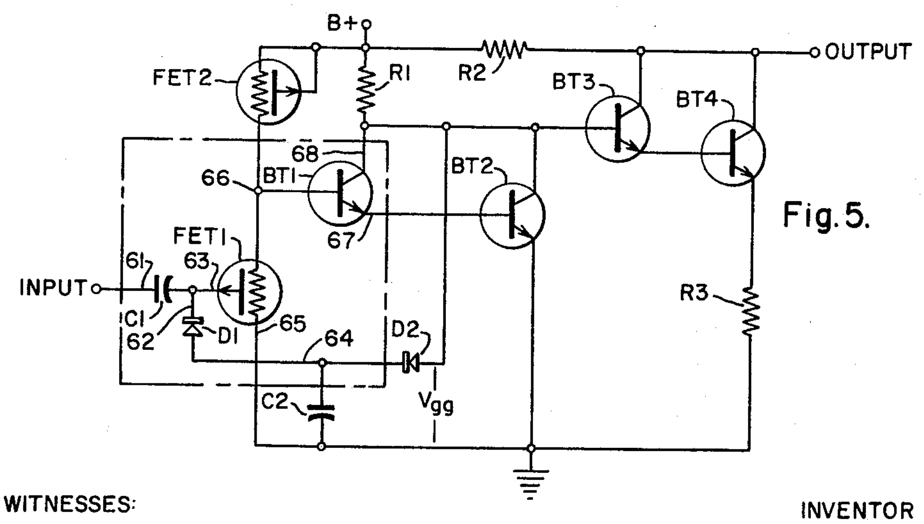
FIG. 5 is a circuit schematic showing the present invention embodied in an audio amplifier.

FIG. 5 shows an audio amplifier circuit employing the present invention. The circuit employs a field effect transistor FET1 to provide a high input impedance for the bipolar transistors BT1, BT2, BT3 and BT4 that are arranged in two successive Darlington stages. FET2, which has its gate and source connected, serves as a constant current source for the amplifier stages. Further description on the manner of operation of a circuit of this type may be found by reference to the before-mentioned copending application Ser. No. 197,975.

A single D.C. supply B+ supplies the bipolar transistors and also provides the bias voltage for FET1. Diodes D1 and D2 are connected in the bias circuit branch with bypass capacitor C2 between their common point and ground in the manner shown in FIG. 4.

The following values are typical for the operation of this circuit:

| | |
|---|---|
| Resistance R**1** | 50K ohms. |
| Resistance R**2** | 30K ohms. |
| Resistance R**3** | 6K ohms. |
| Blocking capacitor C**1** | 200 picofarads. |
| Bypass capacitor C**2** | 1000 picofarads. |
| B+ | 6 volts. |
| Input signal level | 1 volt R.M.S. |
| Gate current | $10^{-9}$ amperes. |
| Diode resistances D**1** and D**2** | $2.5\times10^{-7}$ ohms. |
| Bias voltage $V_{gg}$ | 3 volts. |

With a circuit of this type integrated in a silicon integrated circuit gains of 100 to 500 have been achieved in a frequency range of about 50 to 15000 c.p.s.

Figure 6:
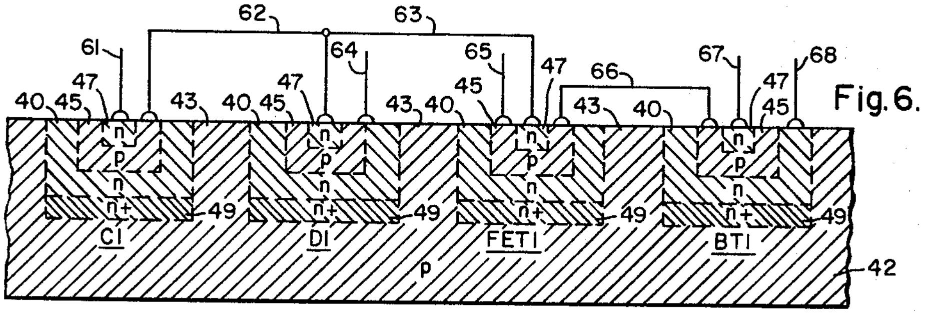
FIG. 6 is a cross sectional view of a partial semiconductor integrated circuit to illustrate a semiconductor structure for providing the functions of the elements enclosed within the dashed line of FIG. 5.

FIG. 6 shows part of an integrated circuit performing the functions of the circuit portion within the dashed line of FIG. 5. Structures for the individual functions C1, D1, FET1 and BT1 are each formed within discrete regions 40 of one semiconductivity type, here n-type, within a surface of a substrate 42 of opposite semiconductivity type, here p-type. Walls 43 of p-type material enclose the discrete n-type regions 40. Each of the discrete regions 40 has a p-type region 45 and an n-type region 47 successively disposed therein. Beneath each of the discrete n-type regions 40 is an n+ region 49, so designated because of its higher doping concentration, included to improve bipolar transistor characteristics in accordance with copending application Ser. No. 193,452, filed May 9, 1962, by H. C. Lin, now Patent No. 3,236,701 and assigned to the assignee of the present invention.

The capacitance for blocking capacitor C1 is provided by the reverse bias on the p-n junction between regions 45 and 47 in structure C1. Capacitance for the bypass capacitor is similarly provided elsewhere in the integrated circuit.

The diode resistance D1, and similarly for D2 elsewhere in the integrated circuit, is provided by the forward bias on the p-n junction between regions 45 and 47 in structure D1 in the manner described in connection with FIGURES 1–4. Contacts are provided to the region 47 and to a short across the junction between regions 40 and 45 to prevent transistor action.

The field effect transistor FET1 is provided by the structure FET1 including a gate region 47 on channel region 45 which has source and drain contacts thereon. The structure for FET2 is similarly provided elsewhere in the integrated circuit.

The bipolar transistor is provided by the structure BT1 where regions 47, 45 and 40 serve respectively as emitter, base and collector regions. The structures for BT2, BT3 and BT4 are similarly provided elsewhere in the integrated circuit.

The resistances R1, R2 and R3 are provided elsewhere in the integrated circuit using similar discrete regions as the discrete regions 40 with a diffused p-type region therein having contacts at its extremities. Since these resistances are small they may be provided by conventional techniques.

The conductive leads and interconnections 61, 62, 63, 64, 65, 66, 67 and 68 shown in FIG. 6 correspond to those shown in FIG. 5. For clarity in illustration they have been shown as external lead wires. However, in practice it is preferred to form the interconnections over an insulating layer on the semiconductive surface.

Materials and techniques for forming structures of the general type of that shown in FIG. 6 are well known in the art and will not be described herein other than to indicate a typical device embodying the present invention. The starting material or substrate 42 may be of monocrystalline p-type silicon having a thickness of about 8 mils and a resistivity of about 20 ohm-centimeters.

By epitaxial growth, for example by the thermal reduction of silicon tetrachloride with hydrogen, layers are formed for the regions 49 and 40. In growing the first layer, an amount of n-type doping impurity such as phosphorous is included with the reactants to provide a resistivity of about 0.005 ohm-centimeter. In growing the second layer, the amount of impurity is reduced to provide a resistivity of about 0.5 ohm-centimeter. Each layer may be about 5 microns thick.

By selective diffusion of a p-type impurity such as boron the isolation walls 43 are formed extending through the epitaxial layers to electrically isolate discrete regions 40 and 49. The selective diffusion operations referred to herein are readily performed using known oxide masking, impurity deposition and redistribution techniques.

By a second selective diffusion of boron, the p-type regions 45 are formed to a surface concentration of about $10^{18}$ atoms per cubic centimeter and a depth of 3 to 4 microns.

By a selective diffusion with an n-type impurity such as phosphorous, the n-type regions 47 are formed with a surface concentration of about $5 \times 10^{20}$ atoms per cubic centimeter and a depth of about 2 to 2.5 microns. At the same time there may be formed an n+ region on the n-type region 40 in BT1 to facilitate the formation of an ohmic collector contact. Oxide passivation and formation of interconnections and ohmic contacts are then performed in a known manner.

It will be apparent that the size and shape of the various regions may be determined in a known manner to achieve desired characteristics of the various functional portions. It is of significance to the present invention that the surface area required for D1 is only about 100 square mils whereas use of a diffused region for its bulk resistance would require at least about 50 times more area.

While the present invention has been shown and described in a few forms only, it will be apparent that various changes and modifications may be made without departing from the spirit and scope thereof.

What is claimed is:

1. In a semiconductor integrated circuit, an active semiconductor device having a signal input with a high input impedance and requiring a bias resistance of at least the order of a megohm, a p-n junction diode having a first region thereof electrically connected to said signal input and a second region electrically connected to a bias potential source that biases said p-n junction diode in the forward direction at an operating point where the incremental diode resistance is at least the order of a megohm; said active semiconductor device and said p-n junction diode comprising semiconductive regions integrally joined in a unitary body with at least one region in each device having the same conductivity type, resistivity and thickness.

2. Electronic apparatus comprising: a field effect transistor including a gate contact for the application of control signals thereto; means to bias said field effect transistor including a p-n junction diode having one contact electrically coupled to said gate contact; a bias potential source electrically coupled to another contact of said diode to bias said diode in the high resistance portion of its forward current-voltage characteristic curve.

3. Electronic apparatus in accordance with claim 2 wherein said field effect transistor and said p-n junction diode each comprise semiconductive regions within a unitary body of semiconductive material; said field effect transistor having a gate region of a first semiconductivity type and a channel region of a second semiconductivity type in p-n junction forming relationship therewith; and said diode having a first region of said first semiconductivity type and a second region of said second semiconductivity type in p-n junction forming relationship therewith.

4. A semiconductor integrated circuit comprising: a unitary body of semiconductive material including a substrate of a first semiconductivity type and means isolating at least two discrete regions of material of a second semiconductivity type; one of said discrete regions having a field effect transistor structure therein including a gate contact for the application of control signals thereto and a second of said discrete regions having a junction diode structure therein with one contact electrically coupled to said gate contact so that upon application of a bias potential to said diode it is biased in the high resistance portion of its forward current-voltage characteristic curve to provide a bias resistance of at least the order of a megohm in an area of the order of 100 square mils or less.

5. Electronic apparatus comprising: a field effect transistor having gate, source and drain contacts; bias means for said field effect transistor comprising a bias potential source and at least one p-n junction diode electrically coupled in series between said drain and gate contacts with said bias potential source placing said diode in the forward quadrant of its current-voltage characteristic curve at an operating point of high incremental resistance.

6. Electronic apparatus in accordance with claim 5 wherein two p-n junction diodes are electrically coupled in series with said bias potential source and a bypass capacitor is electrically coupled between the common point of said p-n junction diodes and said drain contact.

References Cited by the Examiner

UNITED STATES PATENTS

| | | | |
|---|---|---|---|
| 2,703,825 | 3/1955 | MacDonald | 330—138 |
| 2,825,822 | 3/1958 | Huang. | |
| 3,027,518 | 3/1962 | Ketchledge | 330—24 |
| 3,070,762 | 12/1962 | Evans. | |
| 3,075,152 | 1/1963 | Izumi et al. | 330—24 |
| 3,172,051 | 3/1965 | Baron et al. | 330—24 X |

OTHER REFERENCES

Bignell: How to Get Maximum Input Impedance With Field-Effect Transistors, Electronics, pp. 44–46, Mar. 8, 1963.

ROY LAKE, *Primary Examiner.*

F. D. PARIS, *Assistant Examiner.*